United States Patent
Son et al.

(10) Patent No.: US 7,259,069 B2
(45) Date of Patent: Aug. 21, 2007

(54) SEMICONDUCTOR DEVICE AND METHOD OF MANUFACTURING THE SAME

(75) Inventors: Nak-Jin Son, Gyeonggi-do (KR); Ji-Young Kim, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/229,202

(22) Filed: Sep. 15, 2005

(65) Prior Publication Data
US 2006/0008994 A1    Jan. 12, 2006

Related U.S. Application Data

(62) Division of application No. 10/445,109, filed on May 23, 2003, now Pat. No. 7,009,255.

(30) Foreign Application Priority Data
Jul. 4, 2002    (KR) ................ 2002-38708

(51) Int. Cl.
*H01L 21/336* (2006.01)
*H01L 21/8238* (2006.01)
*H01L 21/331* (2006.01)

(52) U.S. Cl. ............ 438/268; 438/269; 438/270; 438/271; 438/272; 438/218; 438/222; 438/357; 438/360; 438/361; 438/429; 257/E21.551; 257/E21.546; 257/E21.545

(58) Field of Classification Search ........ 438/268–272, 438/218, 222, 357, 360, 361, 429
See application file for complete search history.

(56) References Cited

U.S. PATENT DOCUMENTS 4,763,180 A * 8/1988 Hwang et al. ............... 257/302

(Continued)

FOREIGN PATENT DOCUMENTS

EP    0703625 A3    3/1999

(Continued)

OTHER PUBLICATIONS

English language abstract of Korea Publication No. 1998-034616.

(Continued)

*Primary Examiner*—Michael Lebentritt
*Assistant Examiner*—Mohsen Ahmadi
(74) *Attorney, Agent, or Firm*—Marger Johnson & McCollom, P.C.

(57) ABSTRACT

A semiconductor device and a method of manufacturing the same is disclosed. A trench is formed in an active region of a semiconductor substrate. A doped layer is formed on the inner walls of the trench. The trench is filled up with a first semiconductor layer. A gate insulating layer is formed on the first semiconductor layer and the substrate. Two gate electrodes are formed on the gate insulating layer such that the trench is located in between two gate electrodes. First and second impurity regions are formed in the substrate on both sides of each of the gate electrodes. Since the doped layer is locally formed in the trench area, the source and drain regions are completely separated from the heavily doped layer to weaken the electric field of PN junction, thereby improving refresh and preventing punchthrough between the source and drain.

11 Claims, 11 Drawing Sheets

U.S. PATENT DOCUMENTS

| | | | |
|---|---|---|---|
| 4,895,520 A | | 1/1990 | Berg |
| 4,926,233 A | * | 5/1990 | Hutter .................. 257/370 |
| 5,316,965 A | * | 5/1994 | Philipossian et al. ....... 438/424 |
| 5,484,743 A | | 1/1996 | Ko et al. |
| 5,489,543 A | | 2/1996 | Hong |
| 5,521,115 A | * | 5/1996 | Park et al. ................ 438/243 |
| 5,547,903 A | | 8/1996 | Hsu |
| 5,693,542 A | * | 12/1997 | Suh et al. ................ 438/151 |
| 5,773,871 A | * | 6/1998 | Boyd et al. ............... 257/532 |
| 5,963,811 A | | 10/1999 | Chern |
| 5,970,329 A | * | 10/1999 | Cha ......................... 438/197 |
| 6,033,231 A | | 3/2000 | Davies et al. |
| 6,177,332 B1 | | 1/2001 | Chen et al. |
| 6,200,841 B1 | | 3/2001 | Kim |
| 6,204,128 B1 | * | 3/2001 | Hibi et al. ................ 438/270 |
| 6,285,061 B1 | | 9/2001 | Shell et al. |
| 6,358,818 B1 | * | 3/2002 | Wu .......................... 438/431 |
| 6,391,719 B1 | | 5/2002 | Lin et al. |
| 6,514,809 B1 | | 2/2003 | Xiang |
| 6,635,946 B2 | | 10/2003 | Lai et al. |
| 6,724,085 B2 | * | 4/2004 | Tomita ...................... 257/758 |
| 2002/0037619 A1 | | 3/2002 | Sugihara et al. |
| 2003/0207530 A1 | * | 11/2003 | Yu et al. ................... 438/243 |
| 2003/0235958 A1 | * | 12/2003 | Chan et al. ............... 438/270 |
| 2004/0065936 A1 | | 4/2004 | Park |
| 2004/0077148 A1 | | 4/2004 | Lee et al. |
| 2004/0082140 A1 | | 4/2004 | Yang et al. |

FOREIGN PATENT DOCUMENTS

| | | |
|---|---|---|
| JP | 1-138730 | 5/1989 |
| JP | 5-36929 | 2/1993 |
| JP | 7-66399 | 3/1995 |
| JP | 9-45904 | 2/1997 |
| KR | 1998-034616 | 8/1998 |
| KR | 2000-0041699 | 7/2000 |

OTHER PUBLICATIONS

English language abstract of Korea Publication No. 2000-0041699.
English language abstract of Japanese Publication No. 1-138730.
English language abstract of Japanese Publication No. 5-36929.
English language abstract of Japanese Publication No. 7-66399.
English language abstract of Japanese Publication No. 9-45904.

* cited by examiner

SEMICONDUCTOR DEVICE AND METHOD OF MANUFACTURING THE SAME

CROSS REFERENCE TO RELATED APPLICATIONS

This application is a Divisional of U.S. patent application Ser. No. 10/445,109, filed on May 23, 2003, now U.S. Pat. No. 7,009,255, which claims priority from Korean Patent Application No. 2002-38708, filed on Jul. 4, 2002, the contents of which are incorporated by reference.

BACKGROUND OF THE INVENTION

1. Field of the Invention

This disclosure relates to a semiconductor device and a method of manufacturing the same. More particularly, the disclosure relates to a semiconductor device capable of preventing the "punchthrough" phenomenon between source and drain regions of a transistor, improving the refresh characteristics of a memory cell, and a method of manufacturing the same.

2. Description of the Related Art

FIG. 1 is a cross-sectional view of a conventional MOS transistor. Referring to FIG. 1, the MOS transistor comprises a gate electrode 3 stacked on a semiconductor substrate 1 with a gate oxide layer 2 interposed between them, with source regions 4 and drain region 5 formed on the surface portions of the substrate 1 adjacent to either side of the gate electrode 3.

Carriers such as electrons or holes are supplied at the source region 4 and are removed at the drain region 5. The gate electrode 3 plays the role of forming a surface inversion layer, i.e., a channel, extending between the source region 4 and the drain region 5.

When scaling down the MOS transistor as the integration level of semiconductor devices increases, the reduction in the length of the gate electrode is far more dramatic than the reduction of the operating voltage. With the down scaling of the gate length, the influence of the source/drain upon the electric field or the potential in the channel region of the MOS transistor is considerable. This influence is known as the "short channel effect" and a lowering of the threshold voltage is a typical result of this phenomenon. This is because the channel region is greatly influenced by the depletion charge, the electric field, and the potential distribution of the source/drain regions as well as the gate electrode.

In addition to a decreased threshold voltage, punchthrough between the source and drain regions is another severe problem accompanying the short channel effect.

In the MOS transistor of FIG. 1, the drain depletion layer 7 is widened in proportion to the increase in the drain voltage, so that the drain depletion layer 7 comes close to the source region 4. Thus, the drain depletion layer 7 and the source depletion layer 6 are completely connected to each other when the length of the gate electrode 3 is decreased. The electric field of the drain may eventually penetrate into the source region 4 and thereby reduce the potential energy barrier of the source junction. When this occurs, an increased number of major carriers in the source region 4 possess sufficient energy to overcome the barrier. Thus, a larger current flows from the source region 4 to the drain region 5. This effect is called the "punchthrough" phenomenon. When punchthrough occurs, the drain current is not saturated but rapidly increases towards the saturation region.

In general MOS transistor technology, a threshold voltage ($V_t$) adjustment is performed in order to secure the desired threshold voltage. The threshold adjustment is an implant process. For example, a p-type impurity such as boron (B) is ion-implanted in the NMOS transistor.

When the drain voltage is relatively small in the short-channel MOS transistor, the drain depletion layer is not directly in contact with the source region. However, the surface of the substrate is depleted to some degree by the gate electrode, thereby varying the height of the potential barrier near the source. This is known as "surface punchthrough". The threshold adjustment process increases the doping concentration of the interface between the substrate and the gate oxide layer, thereby suppressing surface punchthrough as well as adjusting the threshold voltage.

Accordingly, as down scaling of the gate length progresses, the threshold adjustment process is performed at a high doping concentration to suppress the punchthrough. Typically, the source and drain regions make contact with the heavily-doped threshold adjustment region because the impurities are applied to the entire surface of the substrate. Thus, in the NMOS transistor, the n-type source and drain regions make contact with the p+ region (i.e., threshold adjustment region) to apply the high electric field on the p-n junction, thereby increasing the junction leakage current.

In dynamic random access memory (DRAM) devices, in which a unit memory cell consists of one transistor and one capacitor cell, a "refresh" operation (i.e., a data restoring operation for recharging the data charge) is necessary because the data charge of the capacitor decreases due to the leakage current over time. Typically, the cell transistor is an NMOS transistor. Therefore, the junction leakage current increases due to the high electric field at the p-n junction where the n-type source/drain makes contact with the p+ region (i.e., the threshold adjustment region) when a high dose threshold adjustment implantation is performed. This results in the deterioration of the refresh operation.

U.S. Pat. No. 5,963,811 discloses a method of forming a heavily doped anti-punchthrough region in the interface between the source and drain regions and the cell region through an additional ion-implantation process after the threshold adjustment is performed. Methods of locally forming an anti-punchthrough region directly below the gate electrode are disclosed in U.S. Pat. Nos. 5,484,743; 5,489,543; and 6,285,061.

However, in these methods, the anti-punchthrough region extends to the source and drain regions due to the profile of the lateral projection range (Rp) caused by the ion-implantation. Accordingly, a large electric field is applied to the region where the n-type source and drain regions and the p-type channel region make contact with each other, generating an increased junction leakage current and a deterioration of the refresh operation.

Furthermore, Japanese Patent Laid Open Publication No. 9-045904 discloses a method of forming a partition for preventing punchthrough below the channel region. The partition is formed of an insulator or alternatively formed by filling the interior of the insulator with a conductor. In the case of using a partition comprised of an insulator, the current path of the depletion layer penetrates to the source side when the drain depletion layer meets the partition, thereby generating punchthrough. The method of forming the partition by filling the interior of the insulator with a conductor can prevent this problem, but the required manufacturing process is complicated.

SUMMARY OF THE INVENTION

Embodiments of the invention solve the aforementioned problems. Some embodiments of the invention provide a semiconductor device capable of preventing punchthrough between the source and drain regions of a transistor, while also improving the refresh operation of a memory cell. Other embodiments of the invention provide a method for manufacturing a semiconductor device capable of preventing punchthrough between the source and drain regions of a transistor while also improving the refresh operation of a memory cell. Embodiments of the invention can be applied to all types of PMOS and NMOS devices.

BRIEF DESCRIPTION OF THE DRAWINGS

The above and other objects and advantages of the invention will become readily apparent by reference to the following detailed description when considered in conjunction with the accompanying drawings wherein.

DETAILED DESCRIPTION OF THE INVENTION

Hereinafter, embodiments of the invention will be described in detail with reference to the accompanying drawings. In the following drawings, the same numerals indicate the same elements.

Figure 1:
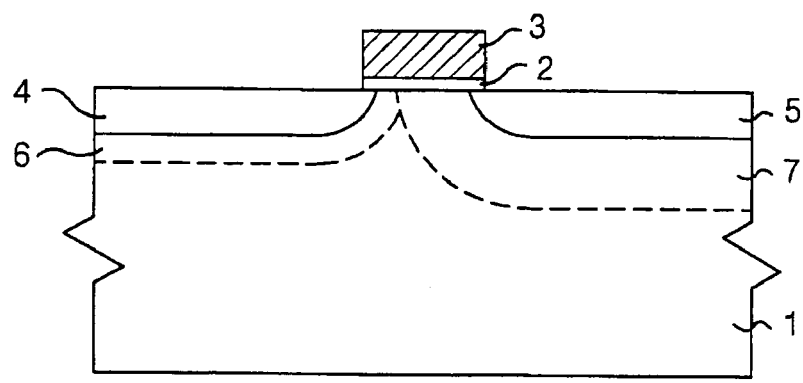
FIG. 1 is a cross-sectional view of a conventional MOS transistor.
Figure 2:
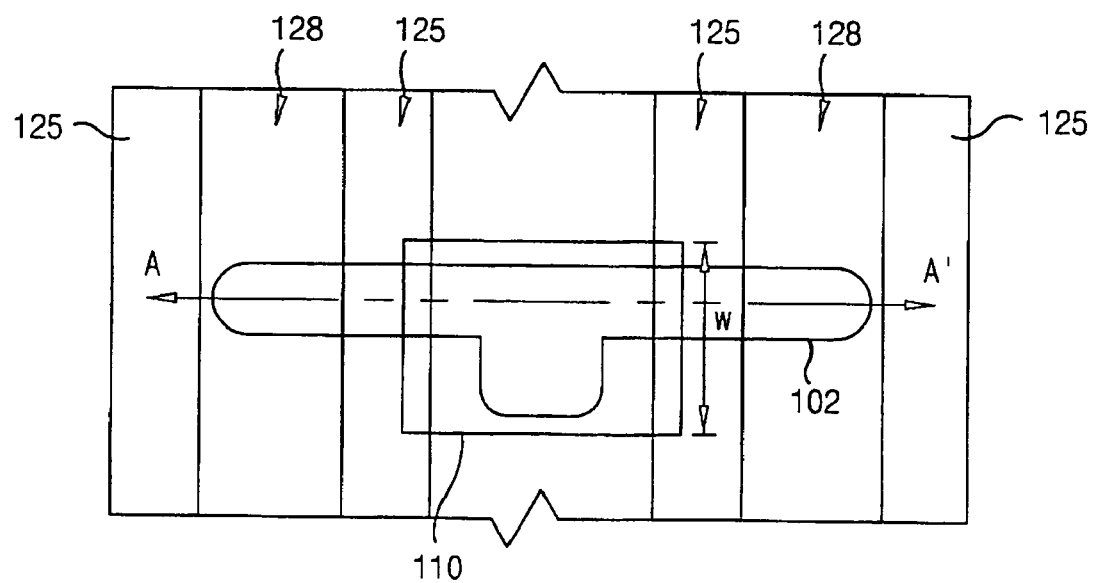
FIG. 2 is a plane view showing a memory cell of a semiconductor device in accordance with an embodiment of the invention.
Figure 3:
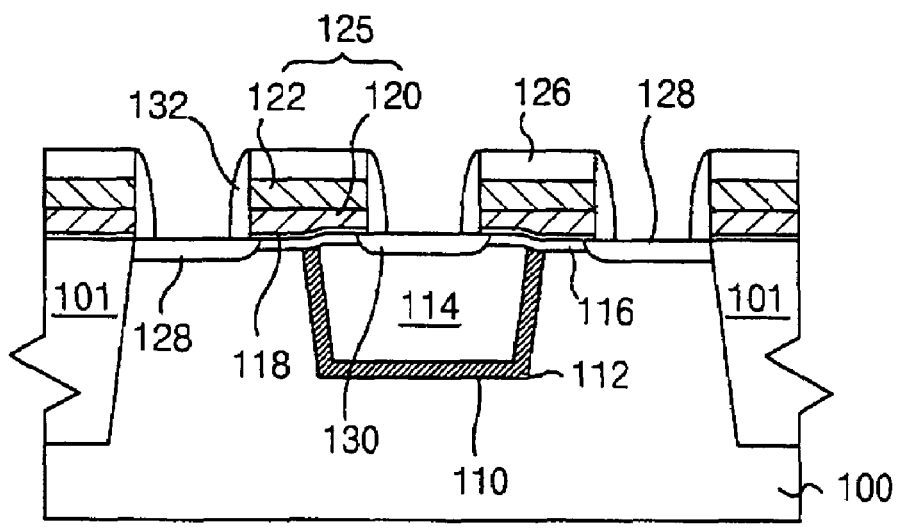
FIG. 3 is a cross-sectional view of the memory cell of the semiconductor device, taken along the line A-A' of FIG. 2.

FIG. 2 is a plane view showing a memory cell of a semiconductor device in accordance with an embodiment of the invention. FIG. 3 is a cross-sectional view of the memory cell, taken along the line A-A' of the FIG. 2.

Referring to FIGS. 2 and 3, a trench 110 is formed in an active region 102 of a semiconductor substrate 100 divided into an isolation region 101 and the active region 102. Preferably, the trench 110 is formed to have a width (w) wider than that of the active region 102. Although the isolation region 101 is formed to have a shallow trench isolation structure in the embodiment of FIG.3, the isolation region 101 may be formed to have a LOCOS-type structure without limiting the present invention.

A doped layer 112 for adjusting a threshold voltage and preventing punchthrough is locally formed along the inner wall of the trench 110. Preferably, the doped layer 112 is a doped silicon epitaxial layer. Alternately, the doped layer 112 may be formed via a delta-doping process or an ion-implantation process.

A first semiconductor layer 114 is formed in the trench 110. Preferably, the first semiconductor layer 114 is an undoped silicon epitaxial layer planarized with the surface of the substrate 110.

A gate insulating layer 118 is formed on the first semiconductor layer 114 and the substrate 100. Preferably, the gate insulating layer 118 is formed on the first semiconductor layer 114 and the substrate with a second semiconductor layer 116 interposed between them. The second semiconductor layer 116 is a layer wherein a surface inversion layer (i.e., channel) is formed. The second semiconductor layer 116 smooths the current flow between the source and drain regions of the semiconductor device. Preferably, the second semiconductor layer 116 is an undoped silicon epitaxial layer formed to have a thickness sufficient to prevent impurities in the doped layer 112 from penetrating the gate insulating layer 118.

Two gate electrodes 125 are formed on the gate insulating layer 118 so that the trench 110 is located between the two gate electrodes 125. Preferably, each of the gate electrodes 125 has a polycide structure consisting of an impurity-doped polysilicon layer 120 and a metal silicide 122 stacked thereon. Preferably, each of the gate electrodes 125 overlaps a portion of the trench 110.

Gate capping layers 126 comprised of silicon nitride are formed on each of the gate electrodes 125. Gate spacers 132 comprised of silicon nitride are formed on the sidewalls of each of the gate electrodes 125.

A first impurity region (e.g., source regions) 128 and a second impurity region (e.g., drain regions) 130 are formed in the substrate on both sides of each of the gate electrodes 125. Between two gate electrodes 125 there is formed one drain region 130. According to this embodiment, although the source region 128 and drain region 130 are formed in the surface portion of the second semiconductor layer 116 and the substrate 100 as shown in FIG. 3, source region 128 and drain region 130 may be formed to have a depth shallower than the thickness of the second semiconductor layer 116 without limiting the scope of the invention.

Furthermore, although not shown in FIG. 3, a capacitor is formed on the source region 128 and is electrically connected to the source region 128 through a capacitor contact hole. A bit line is formed on the drain region 130 and is electrically connected to the drain region 130 through a bit line contact hole.

According to this embodiment, the heavily doped layer 112 on the inner wall of the trench 110 is completely separated from source region 128 and drain region 130 of the transistor. Thus, the electric field of the P-N junction is weakened, reducing the junction leakage current and improving the refresh operation. Furthermore, punchthrough between the source region 128 and drain region 130 is prevented due to the heavily doped layer 112.

FIGS. 4A to 4F are cross-sectional views illustrating a method of manufacturing the memory cell of the semiconductor device shown in FIG. 3.

Figure 4A:
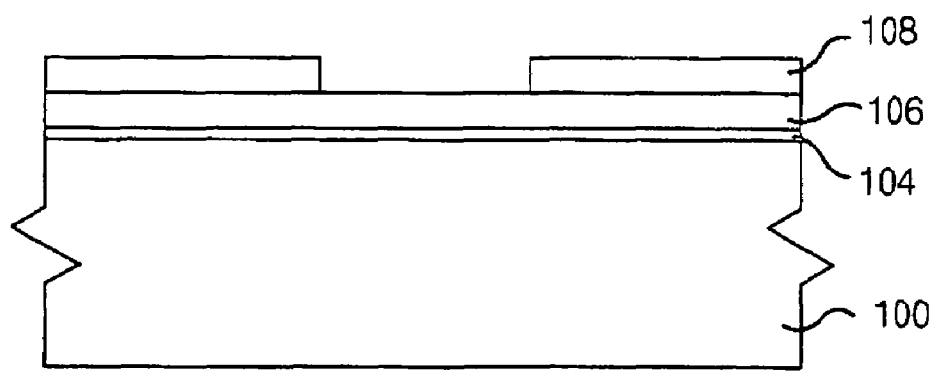
FIGS. 4A to 4F are cross-sectional views illustrating a method of manufacturing the memory cell of the semiconductor device as shown in FIG. 3.

Referring to FIG. 4A, through a thermal oxidation process, an oxide layer 104 with a thickness of about 60~80 Å is formed on a semiconductor substrate 100. Upon the oxide layer 104 a nitride layer 106, such as $Si_3N_4$, is deposited to a thickness of about 1500~2000 Å by a low-pressure chemical vapor deposition (LPCVD) method. After coating the nitride layer 106 with a photoresist film, the film is exposed and developed, forming a photoresist pattern 108 that defines where an active region of a memory cell will be located.

Figure 4B:
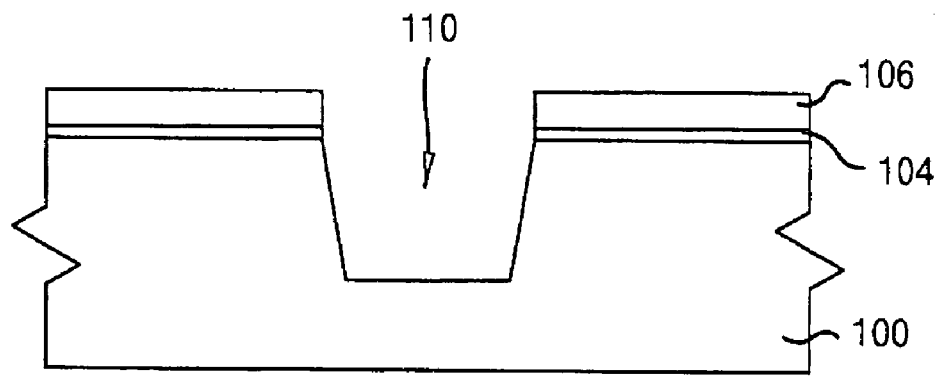

Referring to FIG. 4B, the nitride layer 106 and the oxide layer 104 are etched away using the photoresist pattern 108 as an etching mask.

Successively, the exposed semiconductor substrate 100 is anisotropically etched to a predetermined depth to form a trench 110 in the active region of the memory cell. Preferably, the trench 110 has a width wider than that of the active region. Next, the photoresist pattern 108 is removed through ashing and stripping processes.

Figure 4C:
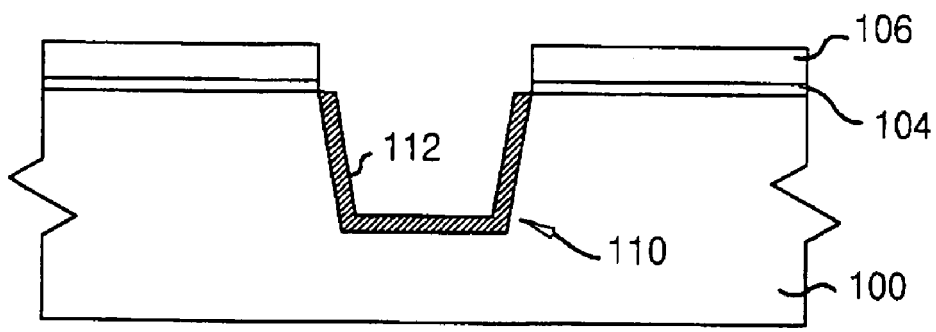

Referring to FIG. 4C, a heavily doped silicon layer 112 is formed on the inner wall of trench 110. The doped silicon layer 112 is grown by selective epitaxial growth using silicon atoms of the substrate 100 exposed in the trench 110 as seeds.

Figure 4D:
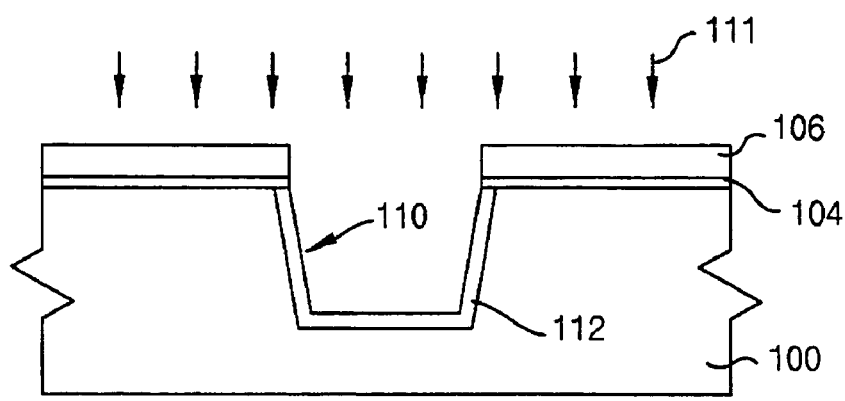

Alternately, as shown in FIG. 4D, the exposed inner wall of the trench 110 is doped with a p-type impurity 111 by an ion-implantation process or a delta-doping process, thereby forming the heavily doped layer 112 on the inner wall of the trench 110. Preferably, in the delta-doping process, a gas containing boron (B) is applied in a plasma state to dope the inner wall of the trench 110 with a heavily doped p+ type impurity.

The heavily doped layer 112 formed on the inner wall of trench 110 adjusts the threshold voltage (Vt) of the transistor and prevents punchthrough between the source and drain regions. In the conventional method, the Vt adjust region and the anti-punchthrough region are formed individually through the threshold adjustment implant step and the anti-punchthrough implant step. In this embodiment, both the threshold adjustment and anti-punchthrough implant are simultaneously achieved due to the heavily doped layer 112 formed by any one of the epitaxial growth, ion-implantation, or delta-doping processes. Here, when the heavily doped layer 112 is formed via an epitaxial growth process, the threshold voltage is adjusted by optimizing the film thickness and the doping concentration.

Figure 4E:
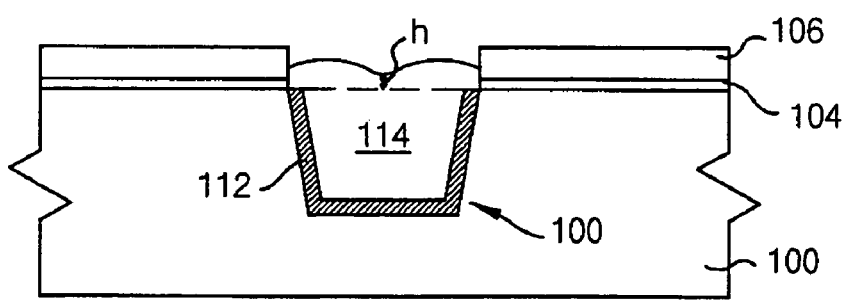

Referring to FIG. 4E, after forming the heavily doped layer 112 on the inner wall of the trench 110 as described above, a first semiconductor layer 114 is formed so as to fill up the trench 110. Preferably, the first semiconductor layer 114 is an undoped silicon epitaxial layer. In this case the deposition conditions are optimized such that the silicon epitaxial layer is selectively grown only on the substrate 100. Accordingly, the first semiconductor layer 114 is grown in an irregular shape because no silicon epitaxial layer is grown on the nitride layer 106 or the oxide layer 104. Deposition conditions are set up such that the lowest height of the first semiconductor layer 114 is higher than the surface of the substrate 100 (see "h" in FIG. 4E).

Figure 4F:
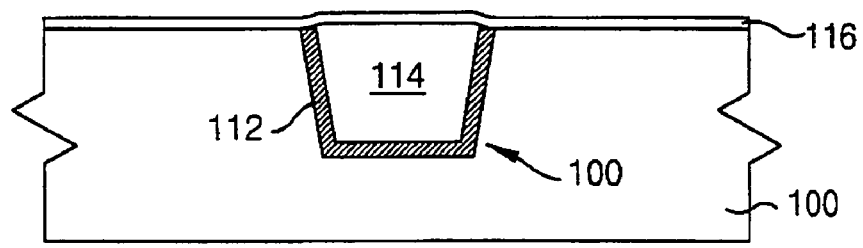

Referring to FIG. 4F, the first semiconductor layer 114 is removed down to the level of the oxide layer 104 (FIG. 4E) by a chemical-mechanical polishing (CMP) process. Here, the CMP process may be carried out until the first semiconductor layer 114 is planarized with the surface of the substrate 100, or it may be stopped when the first semiconductor layer 114 protrudes somewhat from the surface of the substrate 100.

Next, the nitride layer 106 of FIG. 4E is removed by a wet etching process using a nitride etchant such as phosphoric acid. Then, the oxide layer 104 is removed by a wet etching process using an oxide etchant such as LAL.

Thereafter, as shown in FIG. 4F, an undoped silicon layer is grown on the first semiconductor layer 114 and the substrate 100 via an epitaxial growth process, thereby forming a second semiconductor layer 116. The second semiconductor layer 116 is a layer wherein a surface inversion layer (i.e., channel) is formed. The second semiconductor layer 116 functions to smooth the current flow. Preferably, the second semiconductor layer 116 has a thickness sufficient to prevent impurities in the doped layer 112 from penetrating to the gate insulating layer 118.

Next, an isolation process such as a shallow trench isolation (STI) is performed on the substrate 100, forming an isolation layer 101. Specifically, a pad oxide layer, a nitride layer and a first CVD oxide layer are sequentially stacked on the substrate 100. The first CVD oxide layer and the nitride layer are patterned by a photolithography process to form a mask layer pattern. Next, using the mask layer pattern as an etching mask, the substrate 100 is etched to a predetermined depth to thereby form an isolation trench. A second CVD-oxide layer, e.g., high density plasma oxide (HDP oxide) layer, is deposited to a thickness sufficient to fill the isolation trench. Then, the second CVD-oxide layer is removed down to the surface of the nitride layer through an etch-back process or a CMP process. At this time, the first CVD layer of the mask layer pattern is removed as well. The nitride layer and the pad oxide layer are sequentially removed by wet etching, thereby forming the shallow trench isolation region 101.

Next, a gate insulating layer 118 comprised of oxide, an impurity-doped polysilicon layer 120, a metal silicide layer 122 and a gate capping layer 126 comprised of nitride are sequentially formed on the isolation region 101 and the second semiconductor layer 116. Through a photolithography process, the gate capping layer 126, the metal silicide layer 122 and the polysilicon layer 120 are patterned to form gate electrodes 125 having a polycide structure.

Through the entire surface of the substrate 100 on which the gate electrodes 125 are formed, impurities of low concentration (e.g., n-type impurities) are ion-implanted to form lightly doped source/drain regions 128 and 130. An insulating layer such as nitride is deposited on the entire surface of the resultant structure and anisotropically etched away to form gate spacers 132 on the sidewalls of the gate electrodes 125. Next, through an ion-implantation process, heavily doped source and drain regions (not shown) of the NMOS transistor are formed on the peripheral circuit area, with the exception of the memory cell area. In the NMOS transistor of the memory cell area, it is more important to prevent current loss than increase the current drivability as determined by the drain saturation current ($I_{dsat}$). In the NMOS transistor of the peripheral circuit area, the current drivability is very important because it affects the entire performance of the chip. Accordingly, in order to simultaneously satisfy both requirements, the NMOS transistor of the memory cell area has a single n-type source/drain junction to minimize the junction damage, while the NMOS transistor of the peripheral circuit area has a source/drain junction of a lightly doped drain (LDD) or a double diffused drain (DDD) structure.

In the above-described first embodiment, the isolation region 101 is formed after the second semiconductor layer 116 (where the channel region of the cell transistor is formed). However, it is obvious that the steps of FIGS. 4A to 4F may also be performed after the isolation region 101 is formed, for instance, after a conventional semiconductor manufacturing process completes the initial step of forming isolation region 101. Furthermore, in the case where trench isolation is applied, the isolation trench and the trench 110 that prevents punchthrough may be formed at the same time.

Figure 5:
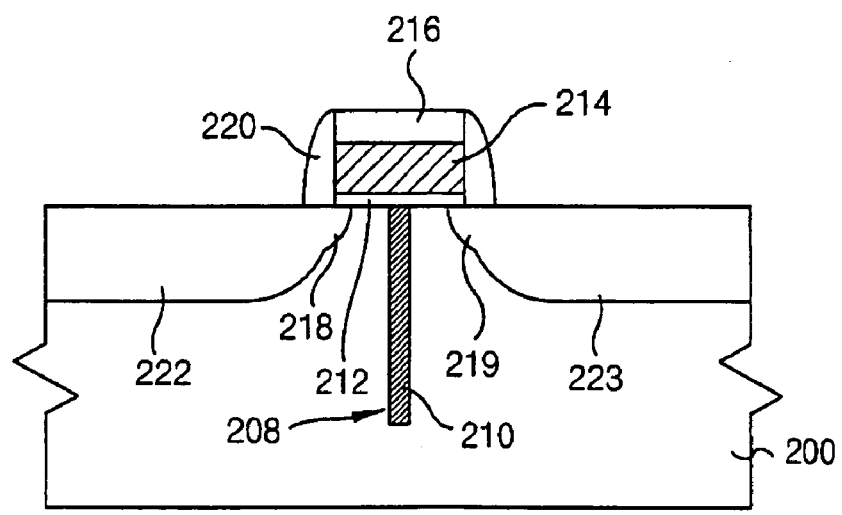
FIG. 5 is a cross-sectional view pf a MOS transistor of a semiconductor device in accordance with another embodiment of the invention.

FIG. 5 is a cross-sectional view of a MOS transistor of a semiconductor device in accordance with another embodiment of the present invention.

Referring to FIG. 5, a trench 208 is formed to a predetermined depth in a region of a semiconductor substrate 200 where a channel region of a transistor will be formed. The trench 208 is filled with a heavily doped layer 210. Preferably, the heavily doped layer 210 is a doped silicon epitaxial layer. It is preferable that the heavily doped layer 210 is planarized with the surface of the substrate 200. The heavily doped layer 210 adjusts the threshold voltage of the transistor and prevents punchthrough.

A gate insulating layer 212, a gate electrode 214, and a gate capping layer 216 are sequentially formed on the doped layer 210 and the substrate 200. Gate spacers 220 are formed on the sidewalls of the gate electrode 214 and the gate capping layer 216.

Lightly doped source region 218 and drain region 219 (i.e., LDD regions) are formed in the substrate on both sides of the gate electrode 214. Heavily doped source region 222 and drain region 223 are formed in the substrate on both sides of the gate spacers 220.

Preferably, the trench 208 is formed so that the dimension of the trench 208 in the length direction of the gate electrode 214 (along the axis perpendicular to the plane of FIG. 5) is less than the length of the gate electrode 214. In order to enhance the anti-punchthrough effect, the trench 208 has a depth greater than that of the heavily doped source/drain regions 222 and 223.

According to this embodiment, the heavily doped layer 210 is formed vertically in the channel region of the transistor, and thus, is completely separated from the heavily doped source region 222 and drain region 223, thereby reducing the junction leakage current and preventing punchthrough.

FIGS. 6A to 6F are cross-sectional views illustrating a method of manufacturing the MOS transistor of the semiconductor device shown in FIG. 5.

Figure 6A:
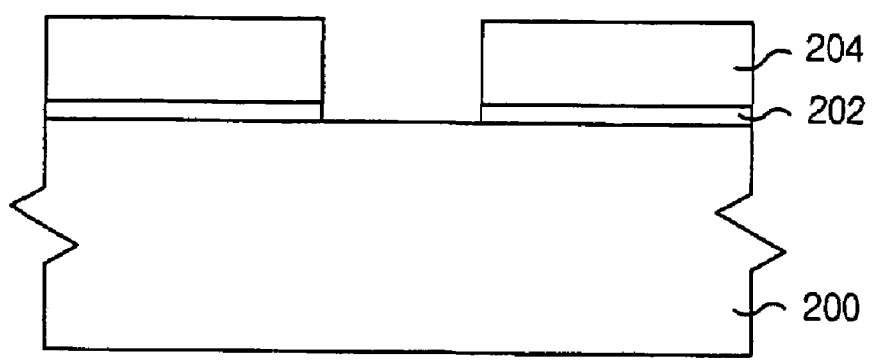
FIGS. 6A to 6F are cross-sectional views illustrating a method of manufacturing the MOS transistor of the semiconductor device shown in FIG. 5.

Referring to FIG. 6A, after sequentially forming an oxide layer 202 and a mask layer on a semiconductor substrate 200, the mask layer is patterned using a photolithography process to form mask layer patterns 204 for opening a portion of a channel region of a transistor. Preferably, the mask layer includes a material having an etching selectivity with respect to the oxide layer, e.g., a nitride.

Figure 6B:
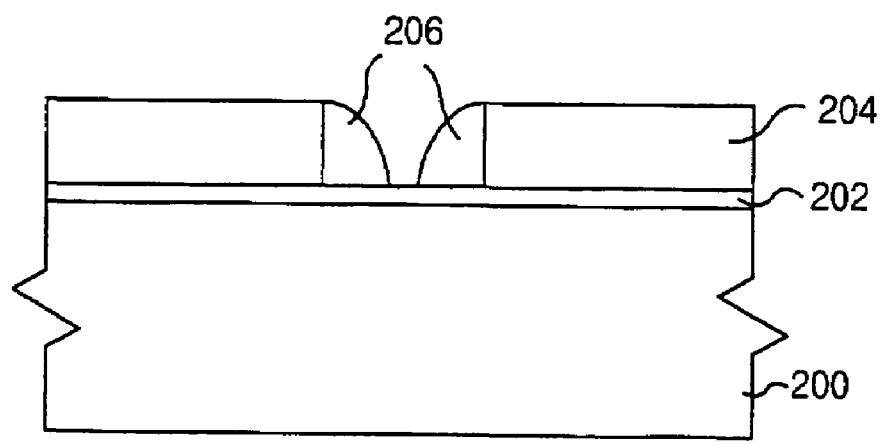

Referring to FIG. 6B, a material having a similar etching rate to that of the material of the mask layer (e.g., nitride) is deposited on the entire surface of the substrate 200 including the mask layer patterns 204. It is then anisotropically etched to form spacers 206 on the sidewalls of the mask layer patterns 204.

Figure 6C:
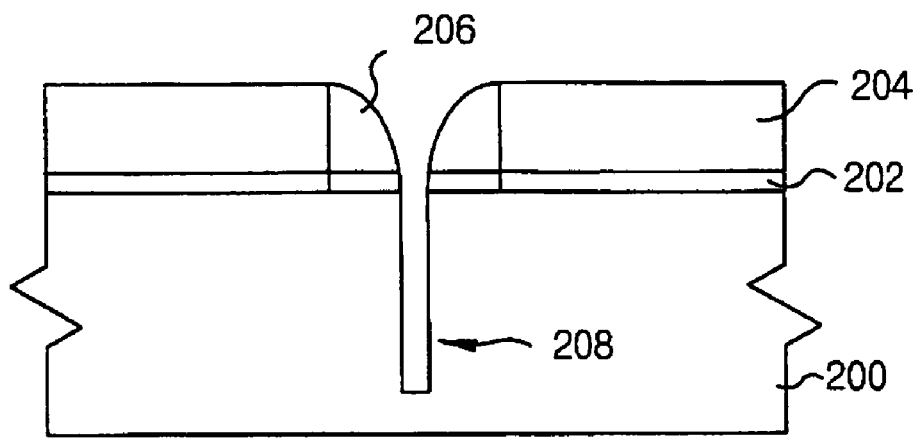

Referring to FIG. 6C, using the mask layer patterns 204 and the spacers 206 as an etching mask, the substrate 200 is anisotropically etched to a predetermined depth, forming a trench 208. Preferably, the trench 208 is formed such that the dimension of the trench 208 in the length direction of a gate electrode 214 in FIG. 5 (along the axis perpendicular FIG. 5) is less than the length of the gate electrode. Furthermore, the trench 208 has a greater depth than that of the source and drain regions. For example, in a MOS transistor where the length of the gate electrode is less than 100 nm, the trench 208 has a width of about 20~30 nm and a depth of about 0.2 µm.

Figure 6D:
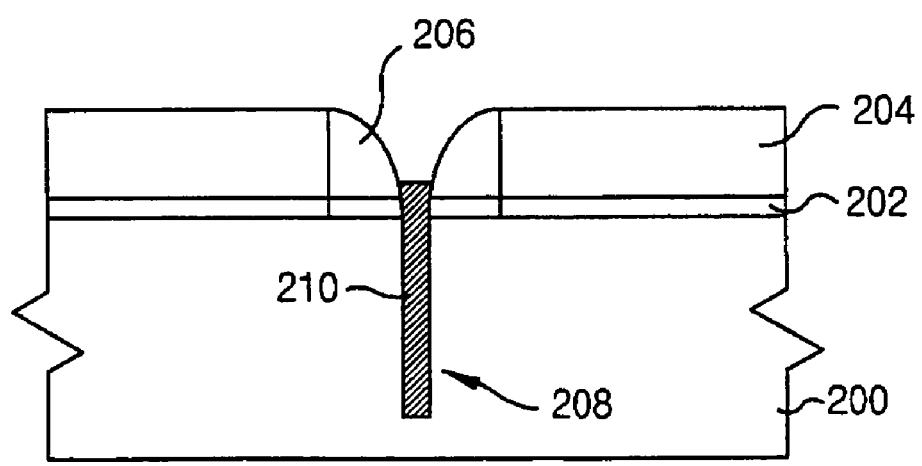

Referring to FIG. 6D, a doped silicon layer is grown by a selective epitaxial growth process using silicon atoms of the substrate 200 that are exposed through the trench 208 as seeds, thereby forming a heavily doped layer 210 filling the trench 208. For example, if the trench 208 has a width of about 20~30 nm and a depth of about 0.2 µm, the doped silicon epitaxial layer has a thickness of about 200~300 Å.

The heavily doped layer 210 adjusts the threshold voltage (Vt) of the transistor and prevents punchthrough between the source and drain regions. In the conventional method, the Vt adjust region and the anti-punchthrough region are formed individually through the Vt adjust implantation and the anti-punchthrough implantation. In the present embodiment, the two effects of Vt adjustment and punchthrough prevention are simultaneously achieved due to the heavily doped layer 210 formed by a selective epitaxial growth process. Here, the threshold voltage is adjusted by optimizing the thickness and the doping concentration of the doped layer 210.

Figure 6E:
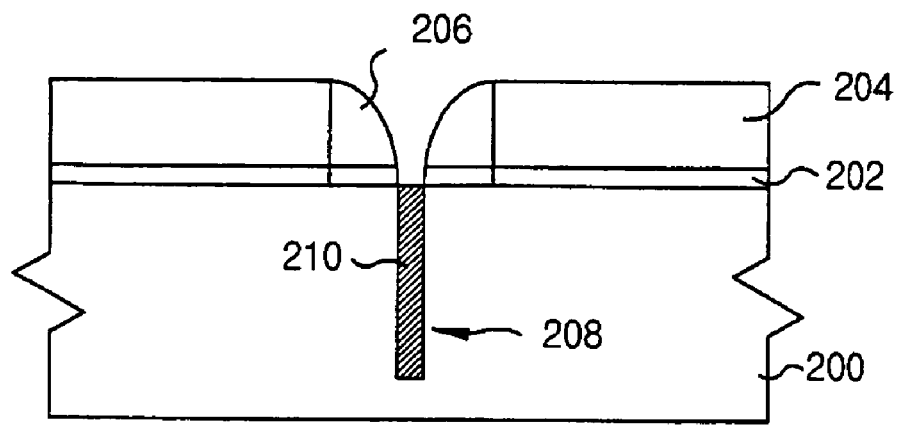

Next, the doped layer 210 protruding from the substrate 200 is removed through a chemical mechanical polishing (CMP) process, resulting in FIG. 6E. Alternately, this process may be omitted.

Figure 6F:
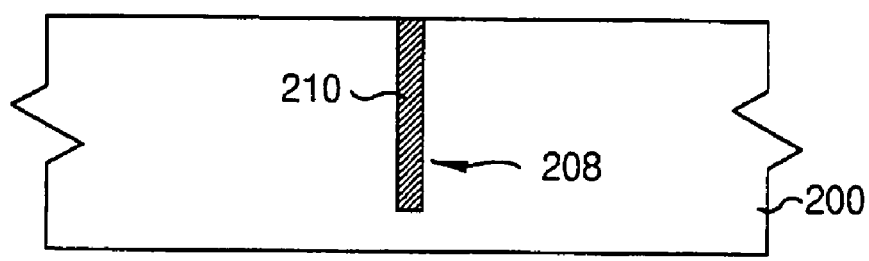

Subsequently, the mask layer patterns 204, the spacers 206, and the oxide layer 202 are sequentially removed, resulting in FIG. 6F.

Thereafter, as shown in FIG. 5, a gate insulating layer 212 including oxide, a gate electrode 214 and a gate capping layer 216 are sequentially formed on the doped layer 210 and the substrate 200. On the entire surface of the substrate 200 on which the gate electrode 214 is formed, impurities at a low concentration (e.g., n-type impurities) are ion-implanted to form lightly doped source region 218 and drain region 219 (i.e., LDD regions).

An insulating layer such as oxide or nitride is deposited on the entire surface of the resultant structure and anisotropically etched away to form gate spacers 220 on the sidewalls of the gate electrode 214. Next, through an ion-implantation process, heavily doped source region 222 and drain region 223 are formed in the substrate 200 on both sides of the gate spacers 220, thereby completing the MOS transistor.

Figure 7:
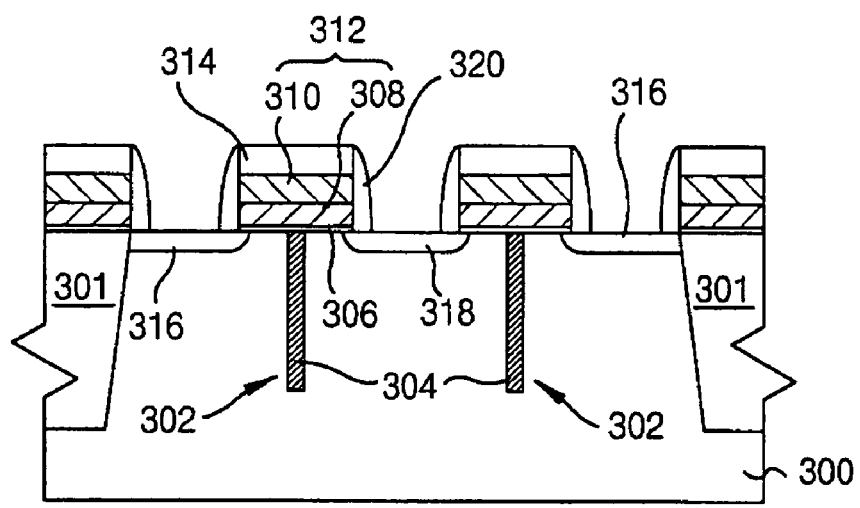
FIG. 7 is a cross-sectional view of a memory cell of a semiconductor device in accordance with yet another embodiment of the invention.

FIG. 7 is a cross-sectional view of a memory cell of a semiconductor device in accordance with yet another embodiment of the present invention.

Referring to FIG. 7, two trenches 302 are formed in an active region of a semiconductor substrate 300 that is divided into an active region and an isolation region 301. Each of the trenches 302 is located in a channel region of a transistor and is formed so that the dimension of the trench in the length direction of a gate electrode is less than the length of the gate electrode.

As illustrated in FIG. 7, the isolation region 301 is formed to have a shallow trench isolation structure in this embodiment. However, the isolation region 301 may also be formed to have a LOCOS-type (LOCal Oxidation of Silicon) structure without limiting the scope of the present invention.

Each of the trenches 302 is filled with a heavily doped layer 304. Preferably, the heavily doped layer 304 is a doped silicon epitaxial layer.

A gate insulating layer 306 is formed on the doped layer 304 and the substrate 300. Two gate electrodes 312 are formed on the gate insulating layer 306 corresponding to each of the trenches 304. Preferably, each of the gate electrodes 312 is formed to have a polycide structure consisting of an impurity doped polysilicon layer 308 and a metal silicide layer 310 stacked thereon.

Nitride gate capping layers 314 are formed on each of the gate electrodes 312. Nitride gate spacers 320 are formed on the sidewalls of each of the gate electrodes 312.

A first impurity region (e.g., source region) 316 and a second impurity region (e.g., drain region) 318 are formed in the substrate 300 on both sides of each of the gate electrodes 312. Here, one drain region 318 is formed between two gate electrodes 312.

Furthermore, although not shown, a capacitor may be formed on the source region 316 to make electrical contact with the source region 316 through a capacitor contact hole. A bit line is formed on the drain region 318 to be electrically connected to the drain region 318 through a bit line contact hole.

According to the present invention, the heavily doped layer 304 filling the trench 302 is formed vertically in the channel region of the transistor and is completely separated from the source region 316 and drain region 318. Hence, the electric field of the PN junction is weakened, decreasing the junction leakage current and improving the refresh. Furthermore, punchthrough between the source regions 316 and drain region 318 is prevented due to the heavily doped layer 304.

FIGS. 8A to 8D are cross-sectional views illustrating a method of manufacturing the memory cell of the semiconductor device shown in FIG. 7.

Figure 8A:
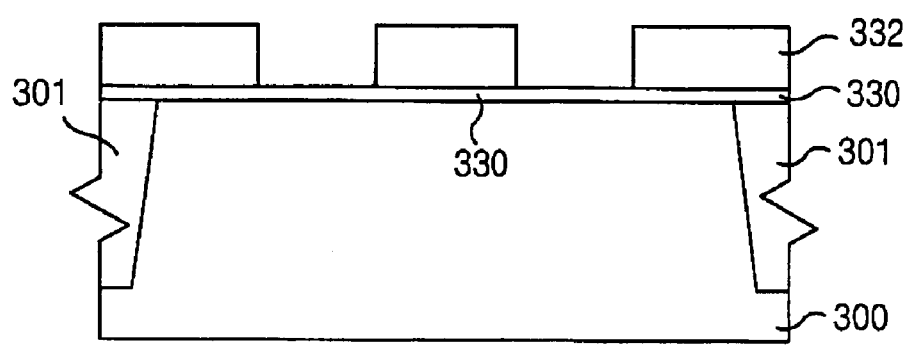
FIGS. 8A to 8D are cross-sectional views illustrating a method of manufacturing the memory cell of the semiconductor device shown in FIG. 7.

Referring to FIG. 8A, a semiconductor substrate 300 is subjected to an isolation process, thereby forming isolation regions 301. Preferably, the isolation process is a shallow trench isolation (STI) process. Specifically, a pad oxide layer (not shown), a nitride layer (not shown) and a first CVD oxide layer (not shown) are sequentially stacked on the substrate 300. The first CVD oxide layer and the nitride layer are patterned via a photolithography process to form a mask layer pattern. Next, using the mask layer pattern as an etching mask, the substrate 300 is etched to a predetermined depth to form isolation trenches. A second CVD-oxide layer (e.g., a high density plasma (HDP) oxide), is deposited to a thickness sufficient to fill the isolation trenches. Then, the second CVD-oxide layer is removed down to the surface of the nitride layer through an etch-back process or a CMP process. At this time, the first CVD layer of the mask layer pattern is removed as well. The nitride layer and the pad oxide layer are sequentially removed by wet etching to form the shallow trench isolation regions 301.

Next, after sequentially forming an oxide layer 330 and a mask layer on a semiconductor substrate 300 and the isolation regions 301, the mask layer is patterned via a photolithography process to form mask layer patterns 332 for opening a portion of a channel region of a cell transistor. Preferably, the mask layer is comprised of a material having an etching selectivity with respect to the oxide layer (e.g., a nitride).

Figure 8B:
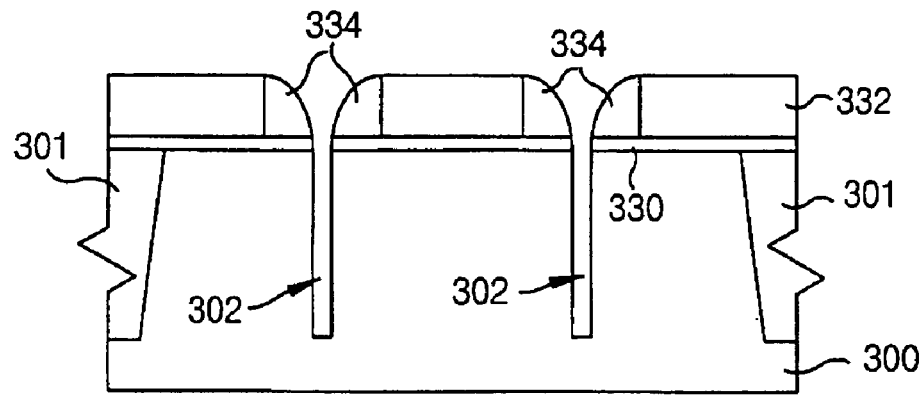

Referring to FIG. 8B, a material having a similar etching rate to that of the material constituting the mask layer (e.g., nitride), is deposited on the entire surface of the substrate 300 including the mask layer patterns 332. Then, it is anisotropically etched to form spacers 334 on the sidewalls of the mask layer patterns 332.

Next, using the mask layer patterns 332 and the spacers 334 as an etching mask, the substrate 300 is anisotropically etched to a predetermined depth to form trenches 302 in the channel regions of each of the transistors. Preferably, the trench 302 has a width narrower than the length of a gate electrode and a depth greater than that of the source/drain regions. For example, in the MOS transistor wherein the length of the gate electrode is less than 100 nm, the trench 302 is formed to have a width of about 20~30 nm and a depth of about 0.2 μm.

Figure 8C:
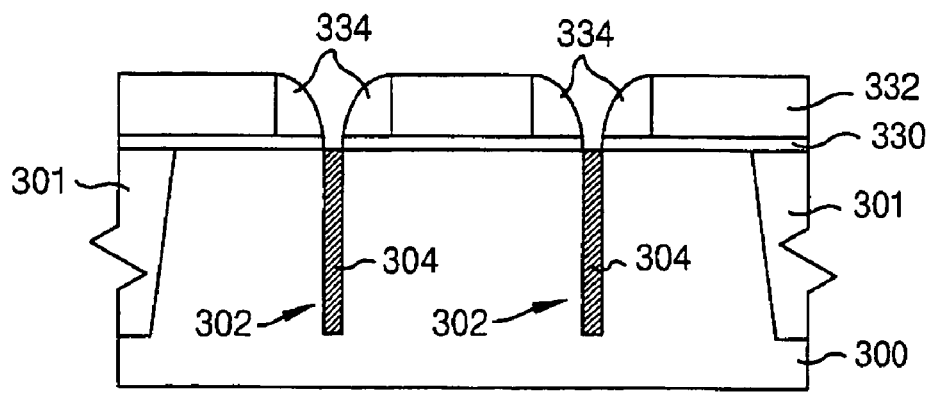
Figure 8D:
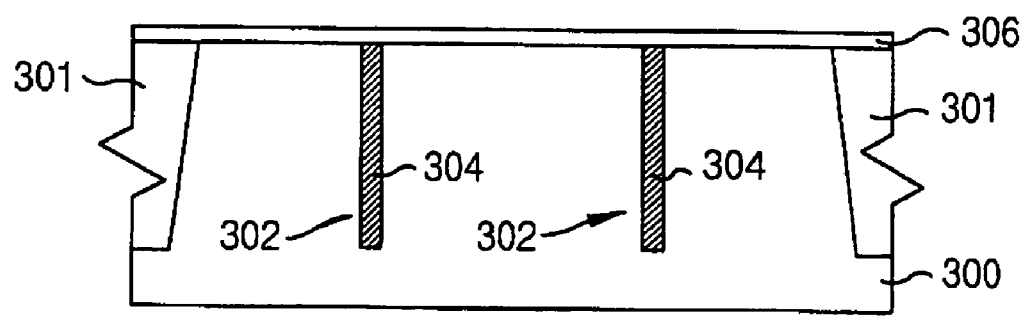

Referring to FIG. 8C, a doped silicon layer is grown by a selective epitaxial growth process using silicon atoms of the substrate 300 exposed through the trenches 302 as seeds, thereby forming heavily doped layers 304 filling the trenches 302. For example, if the trench 302 has a width of about 20~30 nm and a depth of about 0.2 μm, the doped silicon epitaxial layer is formed to have a thickness of about 200~300 Å.

Next, the doped layer 304 protruding from the substrate 300 is removed through a chemical-mechanical polishing (CMP) process. Alternately, this process may be omitted.

Next, the mask layer patterns 332 and the spacers 334 are removed by wet etching process using a nitride etchant such as phosphoric acid, resulting in FIG. 8C. After removing the oxide layer 330 by a wet etching process using an oxide etchant, an oxide gate insulating layer 306 is formed on the doped layers 304 and the substrate 300 through a thermal oxidation process.

Thereafter, as shown in FIG. 7, an impurity-doped polysilicon layer 308, a metal silicide layer 310 and a gate capping layer 314 comprised of nitride are sequentially formed on the gate insulating layer 306. Through a photolithography process, the gate capping layer 314, the metal silicide layer 310 and the polysilicon layer 308 are patterned to form gate electrodes 312 with a polycide structure.

Impurities at a low concentration (e.g., n-type impurities) are ion-implanted on the entire surface of the substrate 300 on which the gate electrodes 312 are formed, thereby forming lightly doped source regions 316 and drain region 318. Next, an insulating layer such as nitride is deposited on the entire surface of the resultant structure and anisotropically etched to form gate spacers 320 on the sidewalls of the gate electrode 312. Through an ion-implantation process, heavily doped source and drain regions (not shown) of the NMOS transistor are formed in the peripheral circuit area but not in the memory cell area.

According to the embodiment as described above, the heavily doped layer is locally formed on the inner wall of the trench located in an active region between two gate electrodes. Alternatively, the trench containing the heavily doped layer is formed directly below the channel region.

The heavily doped layer optimizes the doping concentration of the channel region to adjust the threshold voltage. It also reduces the tendency of the depletion layer to widen in the channel region, thereby increasing the punchthrough voltage. Furthermore, since the heavily doped layer is locally formed in the trench, the source regions and drain region are completely separated from the heavily doped layer, thereby weakening the electric field of the PN junction. Accordingly, the source/drain junction capacitance is reduced and the junction leakage current is decreased, thereby improving the refresh operation.

To reiterate, embodiments of the invention provide a semiconductor device that prevents punchthrough between the source and drain regions of a transistor while improving the refresh operation of a memory cell. Embodiments of the invention also provide a method of manufacturing such a semiconductor device.

Some embodiments of the invention include a semiconductor substrate in which a trench is formed; a doped layer formed at the inner walls of the trench; a first semiconductor layer filling up the trench; a gate insulating layer formed on the first semiconductor layer and the substrate; two gate electrodes formed on the gate insulating layer such that the trench is located in between two gate electrodes; and first and second impurity regions formed in the substrate on both sides of each of the gate electrodes.

According to preferred embodiments of the invention, the doped layer includes a doped silicon epitaxial layer. Alternatively, the doped layer may be formed via a delta-doping process or an ion-implantation process.

Other embodiments of the invention include a semiconductor substrate in which a trench is formed; a doped layer filling up the trench; a gate insulating layer formed on the doped layer and the substrate; a gate electrode formed on the gate insulating layer; and source and drain regions formed in the substrate on both sides of the gate electrode.

In a preferred embodiments, the trench is located in a channel region between the source region and the drain region. The doped layer includes a doped silicon epitaxial layer.

Still other embodiments of the invention include a semiconductor substrate in which two trenches are formed; doped layers filling up each of the trenches; a gate insulating layer formed on the doped layers and the substrate; two gate electrodes formed on the gate insulating layer so as to correspond to each of the trenches; and first and second impurity regions formed in the substrate on both sides of each of the gate electrodes.

Other embodiments of the invention provide a method of manufacturing a semiconductor device that include the processes of forming a trench a the semiconductor substrate; forming a doped layer on the inner wall of the trench; filling the trench with a first semiconductor layer; forming a gate insulating layer on the first semiconductor layer and the substrate; forming two gate electrodes on the gate insulating layer such that the trench is located in between two gate electrodes; and forming source/drain regions in the substrate on both sides of each of the gate electrodes.

Still another embodiment of the invention provides a method of manufacturing a semiconductor device that includes the processes of forming a trench in a semiconductor substrate; filling the trench with a doped layer; forming a gate insulating layer on the doped layer and the substrate; forming a gate electrode on the gate insulating layer; and forming source and drain regions in the substrate on both sides of the gate electrode.

Yet another embodiment of the invention provides a method of manufacturing a semiconductor device that includes the processes of forming two trenches in a semiconductor substrate; filling each of the trenches with doped layers; forming a gate insulating layer on the doped layers and the substrate; forming two gate electrodes on the gate insulating layer so as to correspond to each of the trenches; and forming first and second impurity regions in the substrate on both sides of the gate electrode.

According to some embodiments of the invention, the heavily doped layer is locally formed on the inner wall of the trench formed in an active region between two gate electrodes. Alternately, the trench filled with the heavily doped layer is formed directly below the channel region. It is preferred that the doped layer is formed by epitaxial growth so as to be locally formed directly below the channel region without lateral extension.

The heavily doped layer plays a role of optimizing the doping concentration of the channel region to adjust the threshold voltage. It also reduces the widening of the depletion layer in the channel region, thereby increasing the punchthrough voltage. Furthermore, since the heavily doped layer is locally formed in the trench, the source and drain regions are completely separated from the heavily doped layer, thereby weakening the electric field of the P-N junction. Accordingly, the source-drain junction capacitance is reduced and the junction leakage current is decreased, improving the refresh operation. Embodiments of the invention can be applied to all types of NMOS devices and PMOS devices.

Although multiple embodiments of the invention have been described, it is understood that the invention should not be limited to only these described embodiments. Various changes and modifications may be made by one of ordinary skill in the art, yet still fall within the scope of the invention as hereinafter claimed.

The invention claimed is:

1. A method of manufacturing a semiconductor device comprising:
   forming a trench in a semiconductor substrate, wherein a bottom surface of the trench is defined by the semiconductor substrate;
   forming a doped layer within the trench, wherein the doped layer contacts the bottom surface of the trench;
   forming a gate insulating layer on the doped layer and the substrate;
   forming a gate electrode on the gate insulating layer; and
   forming a source and a drain region in the substrate on both sides of the gate electrode.

2. The method as claimed in claim 1, wherein forming a trench comprises forming a trench in a channel region between the source region and the drain region.

3. The method as claimed in claim 1, wherein forming a trench comprises:
   forming a mask layer pattern on the semiconductor substrate;
   forming spacers on the sidewalls of the mask layer pattern; and
   etching the substrate by using the mask layer pattern and the spacers as an etching mask.

4. The method as claimed in claim 3, further comprising removing the mask layer pattern and the spacers after filling the trench.

5. The method as claimed in claim 1, further comprising planarizing the doped layer with the surface of the substrate after filling the trench.

6. The method as claimed in claim 1, wherein the doped layer comprises a doped silicon epitaxial layer.

7. The method as claimed in claim 1, wherein forming the doped layer comprises filling the trench with the doped layer.

8. The method claimed in claim 1, further comprising forming a first semiconductor layer within the trench and on the doped layer.

9. The method as claimed in claim 8, wherein the first semiconductor layer comprises an undoped layer.

10. The method as claimed in claim 8, further comprising forming a second semiconductor layer on the doped layer, the first semiconductor layer and the substrate, wherein forming the gate insulating layer comprises forming the gate insulating layer on the second semiconductbr layer.

11. The method as claimed in claim 10, wherein the second semiconductor layer comprises an undoped layer.

* * * * *

UNITED STATES PATENT AND TRADEMARK OFFICE
CERTIFICATE OF CORRECTION

PATENT NO. : 7,259,069 B2  Page 1 of 1
APPLICATION NO. : 11/229202
DATED : August 21, 2007
INVENTOR(S) : Nak-Jin Son et al.

It is certified that error appears in the above-identified patent and that said Letters Patent is hereby corrected as shown below:

Column 12, line 49, the words "method claimed" should read -- method as claimed --;
Column 12, line 58, the word "semiconductbr" should read --semiconductor --.

Signed and Sealed this

Sixteenth Day of September, 2008

JON W. DUDAS
*Director of the United States Patent and Trademark Office*